United States Patent [19]
Ogura et al.

[11] Patent Number: 5,991,197
[45] Date of Patent: Nov. 23, 1999

[54] SEMICONDUCTOR MEMORY DEVICE HAVING DATA PROTECTION FEATURE

[75] Inventors: Taku Ogura; Atsushi Ohba; Tsuyoshi Honma; Kazuo Kobayashi, all of Hyogo, Japan

[73] Assignee: Mitsubishi Denki Kabushiki Kaisha, Tokyo, Japan

[21] Appl. No.: 09/046,583

[22] Filed: Mar. 24, 1998

[30] Foreign Application Priority Data

Oct. 17, 1997 [JP] Japan ................................. 9-285221

[51] Int. Cl.$^6$ ................................. G11C 16/04
[52] U.S. Cl. ................ 365/185.11; 365/195; 365/185.04
[58] Field of Search .................. 365/185.11, 185.04, 365/195

[56] References Cited

U.S. PATENT DOCUMENTS 4,974,208  11/1990  Nakamura et al. .................. 365/228
5,592,641  1/1997  Fandrich et al. .................... 395/430
5,673,222  9/1997  Fukumoto et al. ................ 365/185.04

FOREIGN PATENT DOCUMENTS 7-281958  10/1995  Japan .

*Primary Examiner*—David Nelms
*Assistant Examiner*—Hoai V. Ho
*Attorney, Agent, or Firm*—McDermottt, Will & Emery

[57] ABSTRACT

A reset power down mode designating signal and first and second write protect signals are provided to a control circuit. According to the states of these external control signals, the status of unconditional inhibition, unconditional permission, and lock bit (LB) dependency for the protect status of data rewrite is set for each memory block group of a memory array. Therefore, the write protect status can be set in a flexible manner for a nonvolatile semiconductor memory device.

9 Claims, 10 Drawing Sheets

FIG. 2

| /RP | /WP | /XP | BOOT BLOCK REGION | PARAMETER BLOCK REGION | MAIN BLOCK REGION | LOCK BIT LB |
|---|---|---|---|---|---|---|
| HH | X | X | UNLOCK | UNLOCK | UNLOCK | UNLOCK |
| H | H | H | UNLOCK | UNLOCK | UNLOCK | UNLOCK |
| H | H | L | LOCK | LB DEPENDENT | LOCK | LOCK |
| H | L | H | LOCK | LB DEPENDENT | LB DEPENDENT | LOCK |
| H | L | L | LOCK | LOCK | LOCK | LOCK |
| L | X | X | LOCK | LOCK | LOCK | LOCK |

X: ARBITRARY

FIG. 3A
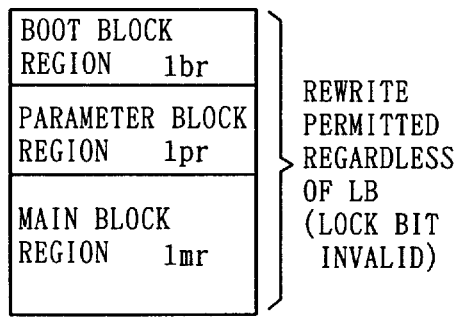

REWRITE PERMITTED REGARDLESS OF LB (LOCK BIT INVALID)

FIG. 3B
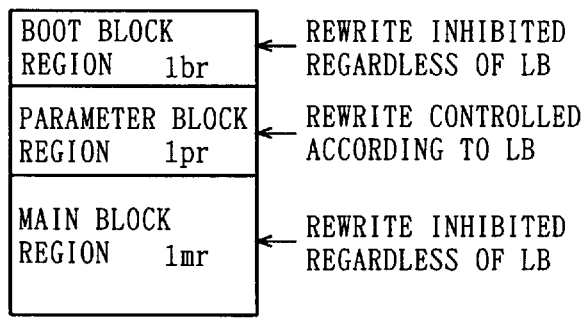

REWRITE INHIBITED REGARDLESS OF LB
REWRITE CONTROLLED ACCORDING TO LB
REWRITE INHIBITED REGARDLESS OF LB

FIG. 3C
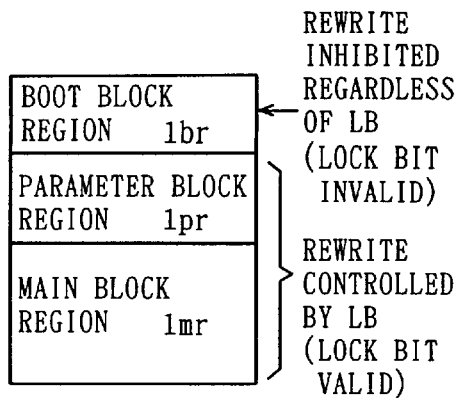

REWRITE INHIBITED REGARDLESS OF LB (LOCK BIT INVALID)
REWRITE CONTROLLED BY LB (LOCK BIT VALID)

FIG. 3D
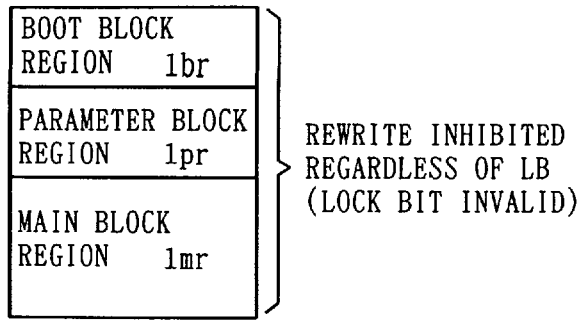

REWRITE INHIBITED REGARDLESS OF LB (LOCK BIT INVALID)

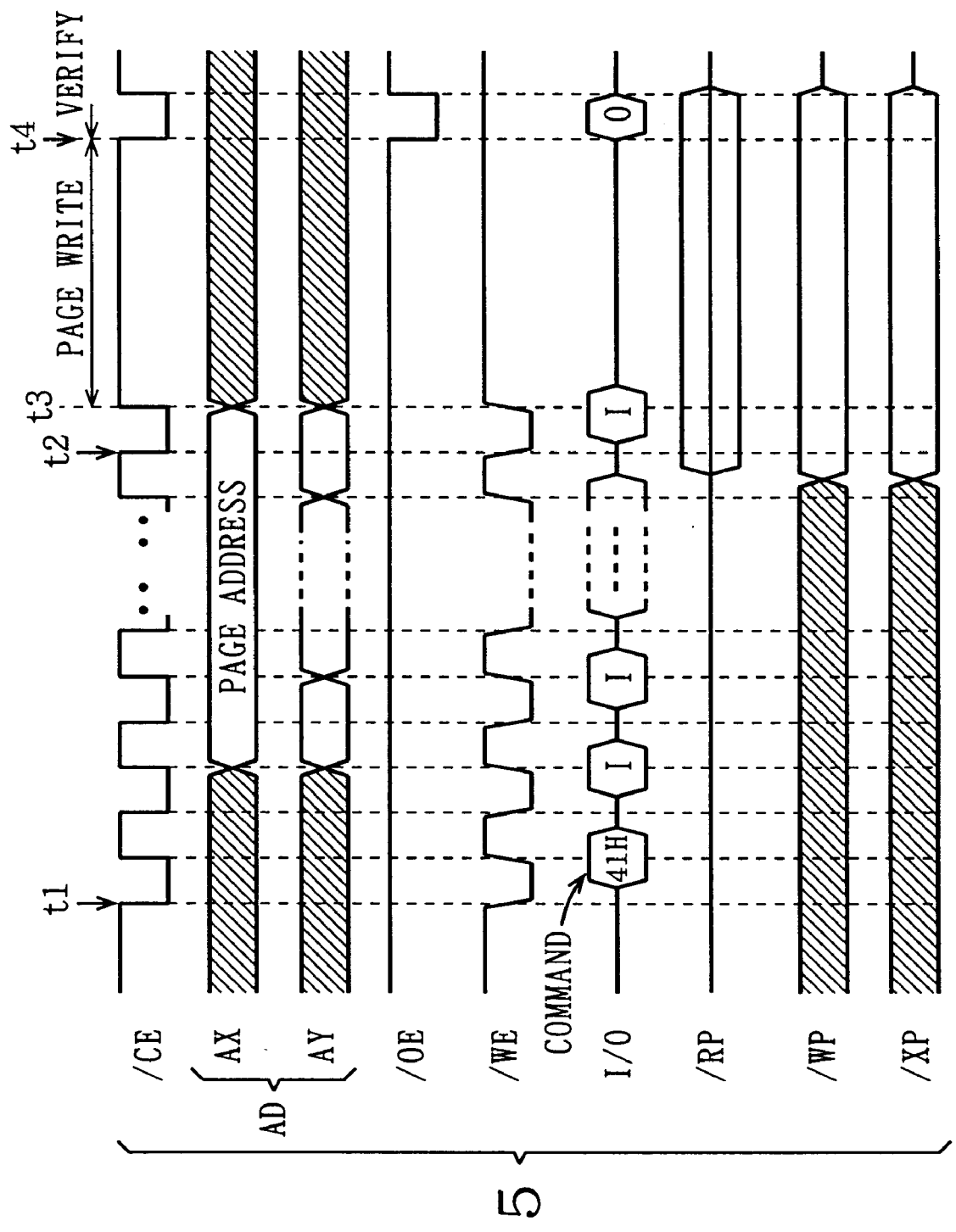
F I G. 5

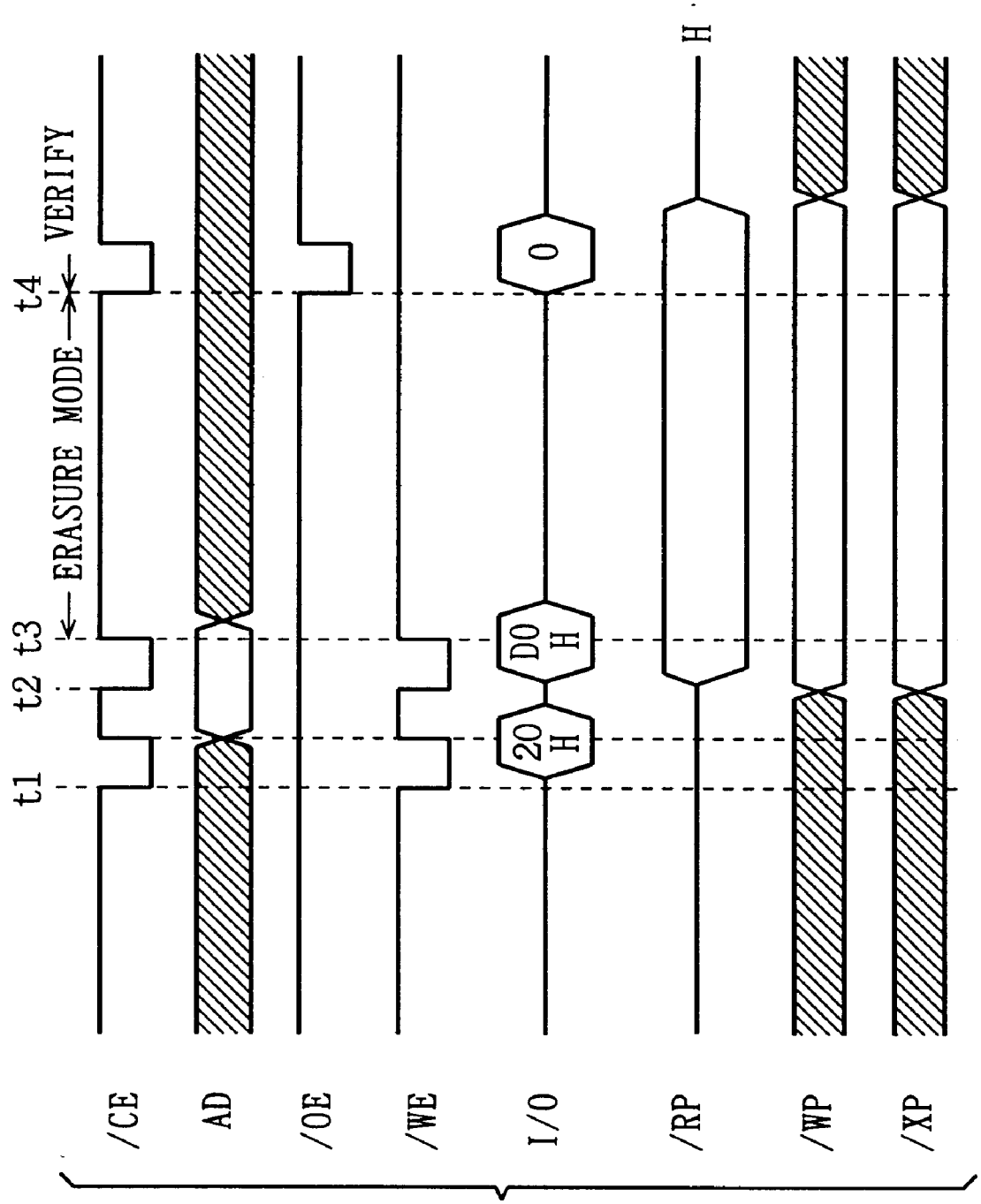
F I G. 7

FIG. 15 PRIOR ART

| /RP | /WP | BOOT BLOCK REGION | PARAMETER BLOCK REGION | MAIN BLOCK REGION | LOCK BIT LB |
|---|---|---|---|---|---|
| HH | X | UNLOCK | UNLOCK | UNLOCK | UNLOCK |
| H | H | UNLOCK | UNLOCK | UNLOCK | UNLOCK |
| H | L | LB DEPENDENT | LB DEPENDENT | LB DEPENDENT | UNLOCK |
| L | X | LOCK | LOCK | LOCK | LOCK |

X: ARBITRARY

SEMICONDUCTOR MEMORY DEVICE HAVING DATA PROTECTION FEATURE

BACKGROUND OF THE INVENTION

1. Field of the Invention

The present invention relates to semiconductor memory devices, and more particularly to a nonvolatile semiconductor memory device having a protect feature against data rewriting. More particularly, the present invention relates to a structure for setting a protection mode on data programming and erasure.

2. Description of the Background Art

A semiconductor memory device is advantageous over a memory device that uses a magnetic disc as a storage medium by virtue of its small size, lightweight, and high speed access, and has a wider application. A nonvolatile semiconductor memory device that stores information in a nonvolatile manner is known as one such semiconductor memory device. This nonvolatile semiconductor memory device has the stored information retained even when the power is turned off. It is used as a program memory or data memory in equipments such as a portable information terminal that employs a battery as the power source. A well known example of a nonvolatile semiconductor memory device is a flash EEPROM (electrically erasable and programmable read only memory: referred to as flash memory hereinafter) having a memory cell formed of one transistor, and that allows increase in integration density and collective erasure of data in a certain address range.

It is premised that information is stored in a nonvolatile manner in the nonvolatile semiconductor memory device such as a flash memory. It is therefore necessary to prevent the nonvolatile data from being rewritten by erroneous programming and erasure. Particularly in the case where the nonvolatile semiconductor memory device is used as a program memory, the stored data must be reliably retained, and any erroneous programming and erasure had to be obviated. For the purpose of preventing erroneous programming and erasure, a "write protect" feature is provided in a nonvolatile semiconductor memory device such as a flash memory. This write protect feature allows a user to apply a lock for any programming and erasing operation on a certain data region (memory block) that should not be written or erased. The write protect feature prevents erroneous programming and erasure on a memory block basis. Here, the term "write" is used as including the erasure step of erasing a memory cell data and the programming step of actually writing data into an erased memory cell.

FIG. 13 schematically shows a structure of the portion related to the writing/erasing operation of a conventional nonvolatile semiconductor memory device. Referring to FIG. 13, a nonvolatile semiconductor memory device includes a memory array 100 having a plurality of nonvolatile memory cells for storing information in a nonvolatile manner, and a protect control data storage region 102 for storing information indicating inhibition/permission of writing and erasure of a nonvolatile memory cell in memory array 100.

Memory array 100 is divided into a plurality of memory blocks 100a–100n. Erasure is carried out block by block.

Protect control data storage region 102 includes a plurality of lock bit storage units 102a–102n provided corresponding to memory blocks 100a–100n, respectively. Lock bit storage units 102a–102n store lock bits LBa–LBn, respectively, indicating inhibition/permission of writing and erasing with respect to corresponding memory blocks 100a–100n. The values of lock bits LBa–LBn indicate whether programming/erasure of memory blocks 100a–100n is allowed or not. Therefore, the writing/erasing operation can be inhibited on a block-by-block basis.

The conventional nonvolatile semiconductor memory device further includes a program/erasure control circuit 103 receiving a chip enable signal /CE, a reset power down mode signal /RP, a write protect signal /WP and a block address signal for controlling the programming/erasing operation of a memory block specified by the block address signal according to lock bits LBa–LBn stored in protect control data storage region 102, and a program/erase circuit 105 for carrying out erasure/programming on a memory block (or page) specified by the address signal under control of program/erasure control circuit 103.

Program/erasure control circuit 103 determines whether a write/erase operation mode is specified or not according to the states of reset power down mode signal /RP and write protect signal /WP when chip enable signal /CE is active. If a write/erase operation is specified, a lock bit LB (LBa–LBn) is read out from the lock bit storage unit provided corresponding to the memory block that is specified by the block address signal, whereby inhibition/permission of write/erasure with respect to the addressed memory block is determined. When a write/erasure operation is permitted, program/erasure control circuit 103 generates a voltage required for programming/erasing and provides the generated voltage to program/erasure circuit 104.

Program/erasure circuit 104 includes an X decoder and a Y decoder that selects a block and a memory cell in memory array 100 according to an address signal.

In the conventional nonvolatile semiconductor memory device, the write protect feature that provides protection with respect to writing and erasing operations has these operations controlled according to reset power down mode signal /RP, write protect signal /WP, and the state of lock bit LB read out from the addressed memory block.

As shown in FIG. 14, memory array 100 is divided into a plurality of regions 100br, 100pr, and 100mr, each including at least one memory block. The nonvolatile semiconductor memory device stores program and data. Allocation of memory blocks to each storage region is determined according to the attribute (or type) of the stored data. In FIG. 14, memory array 100 is divided into a boot block region 100br for storing a boot code and the like that is required at the time of initialization when the power is turned on, a parameter block region 100pr for storing numeric parameters such as a telephone number and identification number that is uniquely used by a manufacturer and a personal user, and a main block region 100mr for storing data that is to be rewritten arbitrarily during actual usage. In the array division structure shown in FIG. 14, a write protect feature as shown in FIG. 15 is implemented according to external control signals /RP and /WP and the lock bit as described below.

(i) When reset power down mode signal /RP is set to a boosted level HH that is higher than the voltage level of a logical high level (H level) in a normal operation mode, writing or erasure can be carried out on all memory blocks 100a–100n in memory array 100 regardless of the state of write protect signal /WP and the value of lock bit LB. The value of lock bit LB can also be rewritten. The writing/erasure of the data in memory array 100 and the writing/erasure (rewriting) of lock bit LB are specified by a command.

(ii) When reset power down mode signal /RP and write protect signal /WP are both set at an H level, writing and erasing can be carried out on boot block region 100*br*, parameter block region 100*pr* and main block region 100*mr* regardless of the value of lock bit LB. Also, writing/erasure can be carried out on lock bit LB.

(iii) When reset power down mode signal /RP is at an H level and write protect signal /WP is at a logical low level (L level) of the ground voltage, writing/erasure is inhibited/permitted according to the value of a corresponding lock bit LB provided for respective memory blocks 100*a*–100*n*. When the value of lock bit LB indicates a lock state, writing and erasure on the corresponding memory block is inhibited. When the value of lock bit LB indicates an unlock state, writing and erasing can be carried on the corresponding memory block. Also, the value of lock bit LB can be rewritten.

(iv) When reset power down mode signal /RP is at an L level, the nonvolatile semiconductor memory device is set to a power down mode, so that internal operation is inhibited. In this power down mode, the nonvolatile semiconductor memory device attains a standby state, so that consumed current is reduced. Under this circumstance, no rewriting of the stored information should occur. Data rewriting (including writing and erasing) of all the memory cells in boot block region 100*br*, parameter block region 100*pr* and main block region 100*mr* in memory array 100 is inhibited regardless of the value of lock bit LB. Similarly, the value of lock bit LB also cannot be rewritten.

The usage of lock bit LB allows the writing and erasing operation to be inhibited/permitted (lock/unlock) by every memory block. The stored data can be prevented from being rewritten by erroneous erasure and programming. Thus, the required data can be reliably retained.

Inhibition/permission of writing and erasing on a memory block basis can be specified by lock bit LB. The validity/invalidity of lock bit LB, i.e., whether writing or erasing is to be carried out independent of the value of lock bit LB, can be set by externally applied control signals, namely reset power down signal /RP and write protect signal /WP. Under the above-described conventional lock control for providing the control of inhibition/permission of writing and erasing, the lock control status is determined in common to all the block regions of the boot block region, the parameter block region, and the main block region according to external control signals /RP and /WP. More specifically, there are three states of (i) permitting writing and erasing on all memory cells of memory array 100 regardless of the value of lock bit LB; (ii) determine inhibition/permission according to lock bit LB; and (iii) inhibiting writing and erasing regardless of the value of lock bit LB. In boot block region 100*br* of memory array 100, the boot program code for initializing the system (equipment: an entire equipment incorporating the nonvolatile semiconductor memory device) when the power is turned on and the control program code required for an interruption process and the like are stored. Reset power down mode signal /RP is set to an HH level when the information required for the nonvolatile semiconductor memory device (referred to as "data" hereinafter including both the code and data) is to be written. This setting is implemented by the manufacturer. In general, reset power down mode signal /RP will not be set to an HH level by a general user (HH level corresponds to a voltage of a further higher level than the normal H level).

Specific numeric parameters such as the identification number, time information and the like for the nonvolatile semiconductor memory device are stored in parameter block region 100*pr*. Additionally, information depending on the application such as the identification number of a personal user, the password number of an IC card, for example, the telephone number of a portable telephone, or the telephone number and address data for implementing the memorandum feature of a portable information terminal are stored in parameter block region 100*pr*. In main block region 100*mr*, audio information for realizing an answer telephone function, and image information of a digital camera and the like according to its application are stored, which can be constantly used and rewritten by the general user. The stored data includes data that must not be rewritten and data that may be rewritten.

However, in the conventional nonvolatile semiconductor memory device shown in FIG. 15, there is a possibility of erroneous writing and erasing where data that should not be rewritten is erroneously altered since inhibition/permission of writing and erasing is set in common to all the memory blocks in memory array 100 when used by the general user. For example, when signals /RP and /WP are both set at an H level, writing/erasing can be carried out on each region of memory array 100. Therefore, the data in all the memory blocks can be rewritten. In this case, there is a possibility of erroneous writing/erasing since the write protect feature is disabled. When signals /RP and /WP are set to an H level and an L level, respectively, the inhibition/permission of writing/erasing is controlled according to the value of lock bit LB. However, the value of lock bit LB can be modified. This means that there is a possibility of erroneous writing/erasing when an erroneous value of lock bit LB is set since control of inhibition/permission of writing/erasing is carried out according to the set value of lock bit LB.

In order to ensure that the numeric parameter once set in the parameter block region is not rewritten during the usage by a general user, it is preferable to control writing/erasing according to the value of lock bit LB as to the writing/erasing operation on a memory block in main block region 100*mr* while setting a lock state for parameter block region 100*pr*. However such lock control cannot be realized in the conventional nonvolatile semiconductor memory device shown in FIG. 15.

Furthermore, when a programming or erasing operation is carried out, inhibition of rewriting the value of lock bit LB cannot be specified. There is a possibility of setting lock bit LB for another memory block to an unlock state, which will result in erroneous writing/erasure.

Thus, it was difficult to prevent erroneous writing/erasing reliably when the lock status is set using a reset power down mode signal /RP and a write protect signal /WP.

SUMMARY OF THE INVENTION

An object of the present invention is to provide a semiconductor memory device that can have erroneous rewriting prevented reliably.

Another object of the present invention is to provide a nonvolatile semiconductor memory device that can set lock status in a more flexible manner.

A further object of the present invention is to provide a nonvolatile semiconductor memory device that can set a lock/unlock state even for a lock bit.

The present invention increases the number of external control signals, whereby the kind of lock states is increased to realize a write protect feature.

The lock state can be set for each memory block region for a plurality of memory block groups at the time of rewriting data. Therefore, the group to have the data rewritten can be differentiated from the region that should reliably retain the stored data with no data rewriting.

Thus, erroneous rewriting can be prevented more reliably.

Since the lock state can be set on a region-by-region basis, a combination of various lock states satisfying the user's needs can be implemented. A write protect feature in accordance with the user's demand can be realized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows the relationship between an external control signal of a control circuit 4 of FIG. 1 and the write protect state.

FIGS. 3A–3D show the protection state of each block region according to the write protect status of FIG. 2.

FIG. 5 shows the sequence of an external control signal in a data writing mode of the nonvolatile semiconductor memory device of the present invention.

FIG. 7 is a waveform showing the sequence of an external control signal in a data erasure mode.

FIG. 15 is a list of the write protect status of a conventional nonvolatile semiconductor memory device.

DESCRIPTION OF THE PREFERRED EMBODIMENTS

First Embodiment

Figure 1:
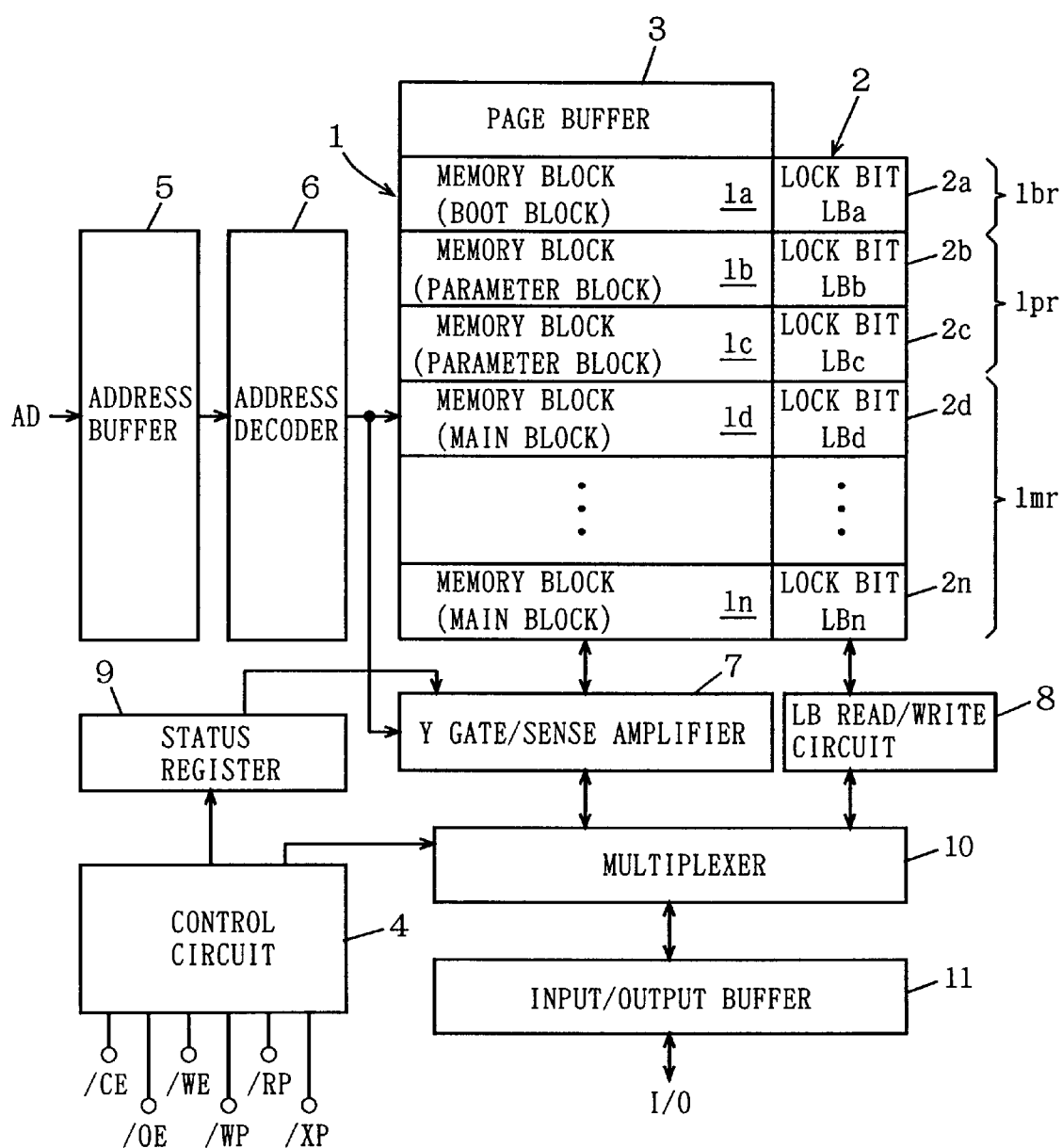
FIG. 1 schematically shows an entire structure of a semiconductor memory device according to a first embodiment of the present invention.

FIG. 1 schematically shows an entire structure of a nonvolatile semiconductor memory device according to a first embodiment of the present invention. This nonvolatile semiconductor memory device of FIG. 1 is, for example, a flash memory, and includes a memory array 1. Memory array 1 includes a plurality of nonvolatile memory cells arranged in a matrix. Memory array 1 is divided into a plurality of memory blocks 1a–1n. Each memory block includes a plurality of memory cells arranged in a matrix.

These memory blocks 1a–1n are divided into a boot block region 1br, a parameter block region 1pr, and a main block region 1mr according to the attribute of the stored data. Memory block 1a is used as the boot block. Memory blocks 1b and 1c are used as the parameter block. Memory blocks 1d–1n are used as the main block.

Here, "attribute" has a meaning similar to the kind of the stored data. More specifically, in memory block 1a which is a boot region 1br, a code that does not have to be rewritten, i.e. a boot code used in bootstrapping the device or system (at the time of power on) and a code of a control program for an interruption process and the like are stored. In memory blocks 1b and 1c of parameter block region 1pr, numeric parameter data that is not so frequently rewritten such as the identification number (ID number) of the memory device, a specific personal user identification number (password number) in the application of an IC card, the telephone number in application of a telephone are stored. In memory blocks 1d–1n of main block region 1mr, data that can be rewritten by the user during general usage is stored. Therefore, the manufacturer writes the required boot code and program code into memory block 1a of boot block region 1br prior to shipment. The required numeric parameter is written by the manufacturer and additional numeric parameters are written subsequently by the end user or a set maker using the memory to make a portable set into memory blocks 1b and 1c of parameter block region 1pr. The data in memory blocks 1d–1n of main block region 1mr is rewritten by the user.

The nonvolatile semiconductor memory device of the first embodiment further includes a protect control data storage region 2 provided corresponding to respective memory blocks 1a–1n for storing the value of lock bit LB that controls the inhibition/permission of writing and erasing of memory blocks 1a–1n. Protect control data storage region 2 includes lock bit storage units 2a–2n for storing lock bits LBa–LBn in a nonvolatile manner for memory blocks 1a–1n, respectively.

The nonvolatile semiconductor memory device further includes a page buffer 3 for storing 1 page of write data at the time of data writing, a control circuit 4 receiving an external control signal such as a chip enable signal /CE, an output enable signal /OE, a write enable signal /WE, a reset power down mode signal /RP, a first write protect signal /WP and a second write protect signal /XP for generating the required internal voltage and internal control signal according to a specified operation mode, an address buffer 5 for receiving an externally applied address signal AD to generate an internal address signal, an address decoder 6 for decoding an internal address signal from address buffer 5 to select an addressed memory cell in memory array 1, a Y gate for selecting an addressed column in memory array 1 according to a column select signal from address decoder 6, and a sense amplifier for sensing and amplifying data read out from a column selected by the Y gate. The Y gate and the sense amplifier are indicated as one block 7 in FIG. 1.

The nonvolatile semiconductor memory device further includes an LB read/write circuit 8 for reading or writing a lock bit corresponding to an addressed memory block from protect control data storage region 2 under control of control circuit 4, a status register 9 for storing status data indicating the internal status of the nonvolatile semiconductor memory device under control of control circuit 4, and a multiplexer 11 selecting one of Y gate/sense amplifier block 7, LB read/write circuit 8, and status register 9 and electrically connecting the selected one to an input/output buffer 11 under control of control circuit 4.

In status register 9, a register is provided for storing status data indicating whether data is programmed properly with respect to a memory cell in data writing and data indicating whether data is properly erased in an erasure operation. LB read/write circuit 8 carries out writing/reading with respect to a corresponding lock bit according to a block address signal (not explicitly shown) when rewrite of a lock bit is specified under control of control circuit 4.

Control circuit 4 generates an internal control signal according to the state of external control signals /CE, /OE, /WE, /WP, /RP and /XP. Control circuit 4 includes a circuit that generates the voltage required for programming and erasing memory cell data and that verifies programming and erasing. Control circuit 4 may be formed of a logic circuit, a processor, or a DSP (Digital Signal Processor). The structure of DSP will be described afterwards.

As shown in FIG. 1, two write protect signals /WP and /XP are used in the nonvolatile semiconductor memory device. In a data rewriting operation for writing or erasure, the protect status is set for each region of 1br, 1pr and 1mr according to reset power down mode signal /RP, and first and second write protect signals /WP and /WP.

FIG. 2 shows a list of the write protection state for the memory blocks of the nonvolatile semiconductor memory device of the first embodiment. The status of the write protect feature realized by control circuit 4 of FIG. 1 will be described below with reference to FIG. 2.

(i) When reset power down mode signal /RP is set to a boosted level HH that is higher than the H level of a normal operation:

Under this state, the data in all memory blocks 1a–1n of memory array 1 can be rewritten regardless of the state of first and second write protect signals /WP and /XP and the value of lock bit LB (lock bit invalid). More specifically, as shown in FIG. 3A, data rewrite in boot block region 1br, parameter block region 1pr and main block region 1mr is permitted regardless of the value of lock bit LB. The manufacturer can write in the codes of a boot program required at the time of data initialization and booting.

Under this state, the value of lock bit LB can also be set.

(ii) When reset power down mode signal /RP and first and second write protect signals /WP and /XP are all at the H level:

Under this state, data rewrite for all memory blocks 1a–1n in memory array 1 is permitted. Also, the value of lock bit LB can be altered. Under this state, data can be rewritten in boot block region 1br, parameter block region 1pr and main block region 1mr as shown in FIG. 3A. The general user can add, for example, a control program. Also, the manufacturer can easily write a product identification number that is the numeric parameter for parameter block region 1pr at the time of incorporation into the system. Furthermore, testing can be carried out easily.

(iii) When reset power down mode signal /RP and first write protect signal /WP are at an H level, and second write protect signal /XP is at an L level:

Under this state, data rewrite with respect to memory blocks 1c and 1d of parameter block region 1pr is determined by the values of corresponding lock bits LBb and LBc (lock bit valid). Data rewrite with respect to memory block 1a of boot block region 1br and memory blocks 1d–1n of main block region 1mr is inhibited independent of the value of lock bit LB. Modification of the value of lock bit LB is also inhibited. The user rewrites the parameter data as necessary.

As shown in FIG. 3B, data rewrite can be carried out selectively for parameter block region 1pr according to a corresponding lock bit LB. The other block regions have data rewriting inhibited unconditionally. Rewriting of lock bit LB is also inhibited.

(iv) When reset power down mode signal /RP and second write protect signal /XP are at an H level, and first write protect signal /WP is at an L level:

Under this state, data rewriting with respect to memory block 1a of boot block region 1br is inhibited regardless of the value of lock bit LB. Data rewriting for the memory blocks of parameter block region 1pr and main block region 1mr is determined according to the value of a corresponding lock bit LB. More specifically, as shown in FIG. 3C, rewriting the boot code in boot block region 1br is definitely inhibited. The data rewriting of parameter block region 1pr and main block region 1mr is controlled according to the value of lock bit LB. Also, rewrite of lock bit LB is inhibited.

(v) When reset power down mode signal /RP is at an H level, and first and second write protect signals /WP and /XP are at an L level:

Under this state, data rewriting for the memory blocks in boot block region 1br, parameter block region 1pr and main block region 1mr is inhibited (lock state) regardless of the value of lock bit LB. More specifically, as shown in FIG. 3D, any data in boot block region 1br, parameter block region 1pr and main block region 1mr cannot be rewritten. Also, the value of lock bit LB cannot be rewritten.

(vi) When reset power down mode signal /RP is at an L level:

Under this state, the deep power down mode is specified, and internal operation of the nonvolatile semiconductor memory device is inhibited. Therefore, any data rewriting operation in boot block region 1br, parameter block region 1pr and main block region 1mr is locked. Also, the rewriting operation of lock bit LB is also locked. Therefore, data cannot be rewritten in all the memory blocks as shown in FIG. 3D.

The lock/unlock state can be set for data rewriting (writing/erasure) in a unit of region as shown in FIGS. 2 and 3A–3D. When the manufacturer writes the data into this nonvolatile semiconductor memory device, the inhibition/permission of data rewrite is determined independent of the lock bit as shown in FIGS. 3A and 3D. In the actual usage by a general user, the data in parameter block region 1pr and main block region 1mr is modified appropriately depending on the processing content. This data rewriting is controlled according to lock bit LB that is set in accordance with software routine. Thus, the lock/unlock status of data rewrite can be set in a flexible manner to realize write protection depending on the processing contents of the user (an applied product maker or a personal user).

As shown in FIGS. 2 and 3A–3D, the lock/unlock state of data rewrite is set region by region. When write protection is implemented according to lock bit LB, value of any lock bit LB cannot be modified. This means that the value of the lock bit LB will not be set erroneously. Also, data rewrite of parameter block region 1pr and main block region 1mr will not occur. Thus, an accurate write protection is implemented.

Parameter block region 1pr is a region that is used by both the manufacturer and the user. Therefore, two states are provided, i.e., the state where data can be rewritten in parameter block region 1pr according to lock bit LB, and the state where data can be rewritten for both parameter block region 1pr and main block region 1mr according to lock bit LB. In the case where data rewrite for parameter block region 1pr and main block region 1mr is controlled according to lock bit LB, data rewrite in boot block region 1br is inhibited (locked). This ensures the program code stored in boot block region 1br such as a boot code that is not to be rewritten from being erroneously rewritten during this data rewrite operation.

In contrast to the conventional case, the lock/unlock state can be set different from region to region, that is, for boot block region, parameter block region, and main block region. Data rewrite can be reliably locked with respect to a relevant region according to the processing contents. The possibility of erroneous writing/erasing of data can be prevented. The erroneous erasing or writing that may occur in the case of setting the protect state in common to the regions can be prevented as shown in FIG. 15. Furthermore, since rewriting of lock bit LB is inhibited when data rewriting according to lock bit LB for parameter block region 1pr or main block region 1mr is permitted, the lock bit can be prevented from being erroneously modified due to the access to that lock bit when data rewriting is effected on the parameter block region and the main block region.

[Structure of Control Circuit]

Figure 4:
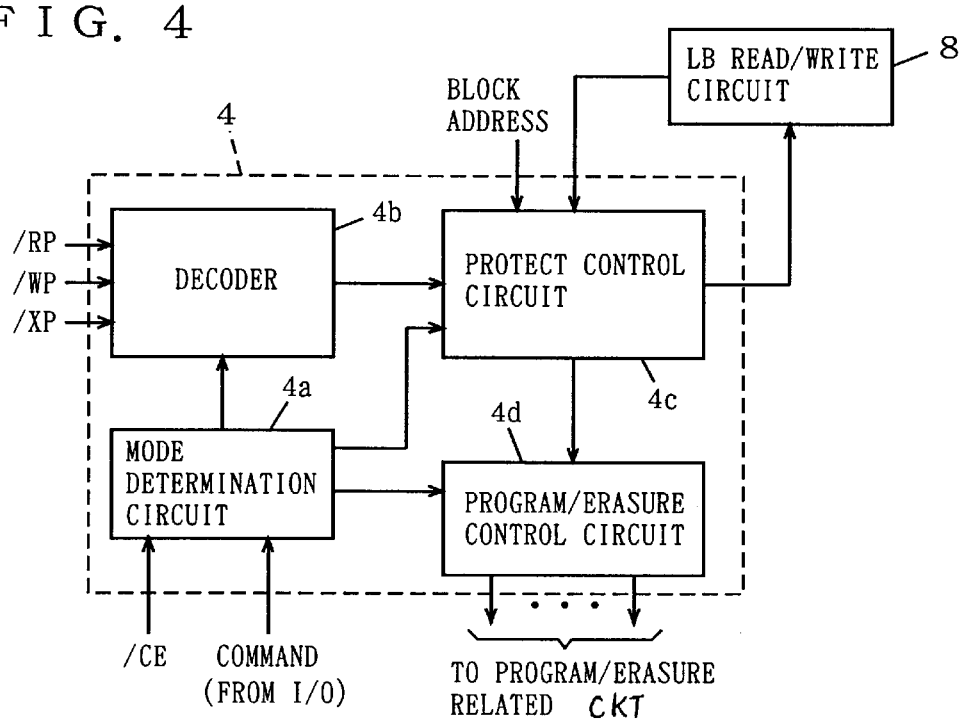
FIG. 4 schematically shows a structure of the control circuit shown in FIG. 1.

FIG. 4 shows the schematic structure of the components related to programming and erasing of the control circuit of FIG. 1. Referring to FIG. 4, control circuit 4 includes a mode determination circuit 4a for receiving an externally applied command via a data input/output pin terminal (I/O), when chip enable signal /CE is active, for determining the specified operation mode, a decoder 4b activated in response to a write/erase designating signal from mode determination circuit 4a to receive external control signals /RP, /WP and /XP and determining the status thereof for providing a signal indicating the determination result, a protect control circuit 4c activated under control of mode determination circuit 4a, and receiving a protect status designating signal and a block address from decoder 4b to determine a protect state (lock state) for an addressed memory block, and a program/erasure control circuit 4d activated in response to a write/erasure designating signal from mode determination circuit 4a for controlling the programming and erasing operation according to a rewrite inhibition/permission designating signal output from protect control circuit 4c indicating whether writing and erasing is inhibited or not.

When chip enable signal /CE is active, mode determination circuit 4a identifies the bit pattern of the input data provided via an input/output buffer according to activation of write enable signal /WE for determining whether writing or erasing is specified or not.

Decoder 4b provides a signal indicating the write protect status according to the combination of the status of externally applied signals /RP, /WP and /XP. The protect status designating signal output from decoder 4b can be generated for each memory block region. Alternatively, a structure shown in FIG. 2 where corresponding internal control signals are rendered active according to respective combinations of the states of the signals can be employed.

When mode determination circuit 4a specifies a writing or erasing operation mode, protect control circuit 4c receives a protect status designating signal and a block address signal from decoder 4b, and a lock bit provided via LB read/write circuit 8 to determine the protect status for an addressed memory block. The activation/inactivation of program/erasure control circuit 4d is controlled according to the determined result.

Program/erasure control circuit 4d includes a program/erasure voltage generation circuit required for programming or erasing and a sequencer for programming/erasure verify to control the programming or erasure operation including the read/write operation of lock bit LB at a predetermined sequence. The generated program/erasure voltage is applied to the address decoder. The required voltage is applied to a word line arranged corresponding to a row, to a bit line arranged corresponding to a column, and to a source line in a selected memory block.

FIG. 5 shows the timing relationship of an external signal in a data writing mode. At time t1, chip enable signal /CE and write enable signal /WE are set to an L level, and a code "41H" is applied to the data input/output terminal (I/O). This code "41H" specifies the data write mode. Mode determination circuit 4a identifies that a data write mode is specified by code 41H. At the next cycle when chip enable signal /CE and write enable signal /WE attain an L level, externally applied write data (I) is received. The currently applied address signal AD (page address AX and column address AY) is set, whereby the write page is specified. Page address AX is set to a states indicating the same page in writing the data. This page address also indicates the block address identifying a memory block. Column address AY is sequentially applied, starting at the head address of the page. According to column address AY, the Y gate in Y gate/sense amplifier block 7 shown in FIG. 1 is sequentially selected. The write data (I) is sequentially latched into page buffer 3 of FIG. 1.

At time t2, the last write data in one page is internally received at the activation of chip enable signal /CE and write enable signal /WE. The transition of chip enable signal /CE and write enable signal /WE at time t3 causes the page write operation sequence to be started internally. At this time t2, external control signals /RP, /WP and /XP are set to predetermined states. According to the status of external control signals /RP, /WP and /XP, the protect state is determined at the page write sequence starting from time t3. The page is written according to the determined protect status.

At completion of this write operation, chip enable signal /CE and output enable signal /OE are driven to the active state of an L level and the data (O) stored in the internal status register are externally read out. An external device determines whether the writing operation has been carried out properly or not in accordance with the value of the read out status register data (O). The next required operation such as writing or reading is then carried out.

Control circuit 4 shown in FIG. 4 determines the protect status according to the states of external control signals /RP, /WP and /XP at the page write sequence starting from time t3. When data is to be written in this page write sequence, first the memory cell data in the selected page is entirely erased, and then data differing from that of the erasure state is written into the corresponding memory cell according to the write data stored in page buffer 3. A verify operation of the programming and erasing is carried out. Data indicating the verified result is stored in the status register.

Figure 6:
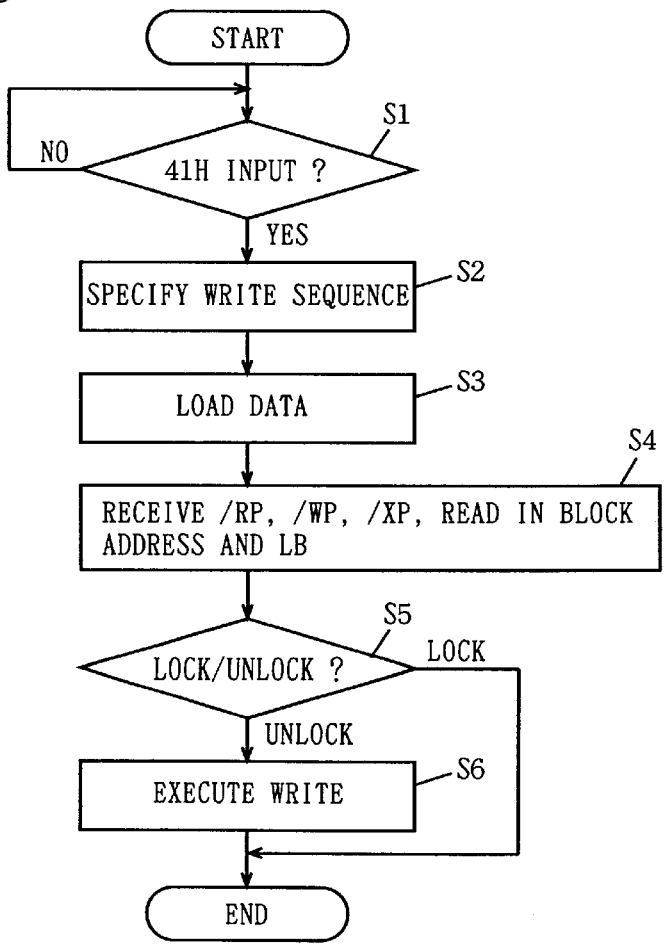
FIG. 6 is a flow chart showing an operation of the control circuit of FIG. 4 in a data writing mode.

FIG. 6 is a flow chart showing an operation of control circuit 4 of FIG. 4. An operation in data writing of control circuit 4 of FIG. 4 will now be described with reference to FIG. 6.

First, mode determination circuit 4a determines whether code 41H is input or not (step S1). Input of code 41H corresponds to designation of a data write mode. Therefore, mode determination circuit 4a specifies a write sequence (step S2). Upon specification of the write sequence, write date is sequentially applied together with an address signal. Determination is made whether all the data in one page has been loaded or not by checking whether column address signal AY out of the applied address signal AD has arrived at the last address in that page.

When the last data is loaded, decoder 4b receives external control signals /RP, /WP and /XP. Also, protect control circuit 4c reads in a block address and a lock bit (LB) from LB read/write circuit 8 that is activated by program/erasure control circuit 4d (step S4). Protect control circuit 4c responds to the lock status designating signal from decoder 4b, lock bit (LB) and a block address to determine whether data writing for the addressed memory block is to be locked or not (step S5).

When an unlock status that permits data writing is specified, writing is carried out according to the data loaded into page buffer 3 shown in FIG. 1 (step S6). When determination is made that the data writing operation is to be locked, no data writing is carried out, and the data write sequence ends. The external device is notified of the termination of data writing through, for example, a ready/busy signal. When the user becomes aware of termination of data writing by this ready/busy signal, the status data stored in the status register can be read out to identify whether the writing operation has been carried out properly. For a lock state, data indicating write disable is stored in the status register. When data writing has been carried out, data indicating completion of writing one page is stored in the status register. By checking this data, the user can identify whether writing has been carried out, i.e. whether lock has been set or not.

As shown in step S4 of FIG. 6, protect control circuit 4c receives a block address, and the lock/unlock state for writing in the addressed region is determined according to external control signals /RP, /WP and /XP and lock bit LB.

FIG. 7 shows the states of the external signals in a data erasure operation. At time t1, chip enable signal /CE is pulled down to an L level of an active state. Under this state, code 20H is applied. Mode determination circuit 4a of FIG. 4 determines that the first command for specifying an erasure mode has been input according to code 20H, and waits for the next command to be applied. At time t2, chip enable signal /CE is set to an L level again, and an external code D0H is applied to the data input/output terminal. When mode determination circuit 4a of FIG. 4 determines that codes 20H and D0H are applied successively according to chip enable signal /CE, an erasure mode is set internally. Then, selective erasure is carried out according to external control signals /RP, /WP and /XP and the value of lock bit LB of the corresponding memory block. When this erasure operation is completed, the ready/busy signal not shown is set to an externally accessible state. The external device can identify completion of the erasure mode. The user can check the data stored in the status register at time t4 to determine whether the erasure has been carried out properly.

Figure 8:
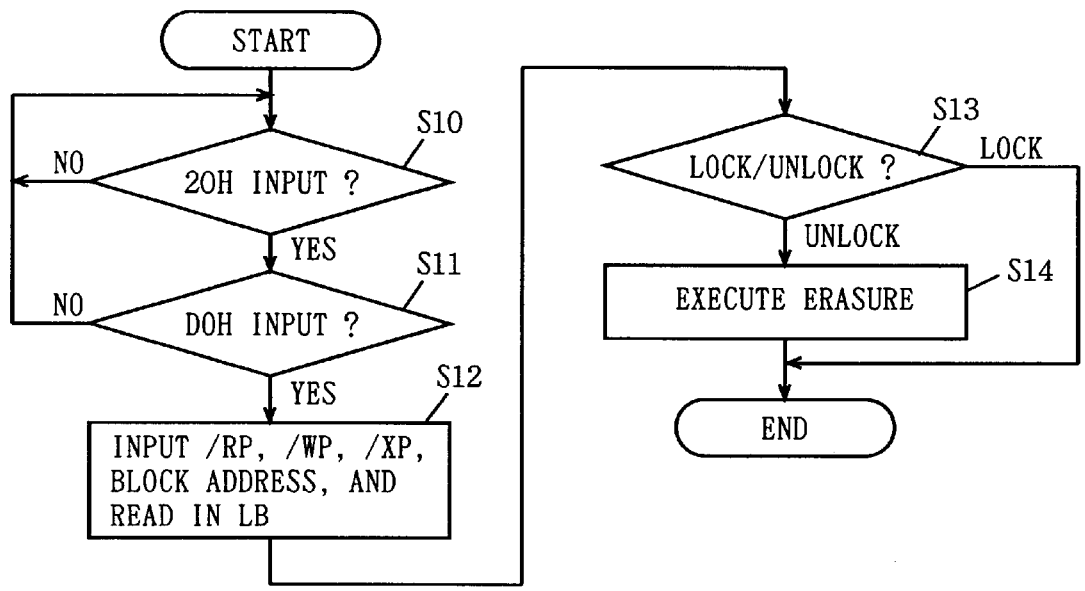
FIG. 8 is a flow chart showing an operation of the control circuit of FIG. 4 in a data erasure mode.

FIG. 8 is a flow chart showing an operation in an erasure mode by the control circuit of FIG. 4.

Referring to FIG. 4, mode determination circuit 4a determines whether code 20H is input or not when chip enable signal /CE is active (step S10). Determination is made that the first command for specifying an erasure mode has been applied by an input of code 20H. Therefore, the next command is waited for. Then, mode determination circuit 4a determines whether code D0H is input or not according to activation of chip enable signal /CE. Mode determination circuit 4a determines that erasure is specified when code D0H is input. Therefore, decoder 4b, protect control circuit 4c and program/erasure control circuit 4d shown in FIG. 4 are activated. Simultaneous to input of code D0H, a block address is applied and latched in a circuit portion not shown to specify the memory block to be erased.

Decoder 4b receives external control signals /RP, /WP and /XP to generate and provide to protect control circuit 4c an internal designating signal according to the combination of the states of these signals under control of mode determination circuit 4a. Program/erasure control circuit 4d responds to a block address signal to read out the value of lock bit LB corresponding to the addressed memory block. Protect control circuit 4c receives a corresponding lock bit LB from LB read/write circuit 8 that is activated by program/erasure control circuit 4d. This protect control circuit 4c also receives a block address (step S12). Protect control circuit 4c determines the inhibition/permission-of erasure on the addressed memory block according to the input signal and lock bit LB (step S13). When it is indicated that erasure can be carried out (i.e., unlock state) in the addressed memory block, program/erasure control circuit 4d is activated. Internal voltage required for erasure is generated, and the addressed memory block is collectively erased (step S14). When erasure in the addressed memory block is inhibited (lock state) in step S13, erasure is not carried out. End of erasure is merely signaled to the external device (by ready/busy signal).

Similarly in the above-described erasure mode, the lock/unlock (inhibition/permission) state of erasure is determined according to external control signals /RP, /WP and /XP, the block address signal, and lock bit LB. The lock/unlock state can be set every memory block.

When code D0H is not input at the second cycle following the input of code 20H in step S11, determination is made that an erasure command is not applied, and control returns to the initial state. This prevents any erroneous erasure.

Figure 9:
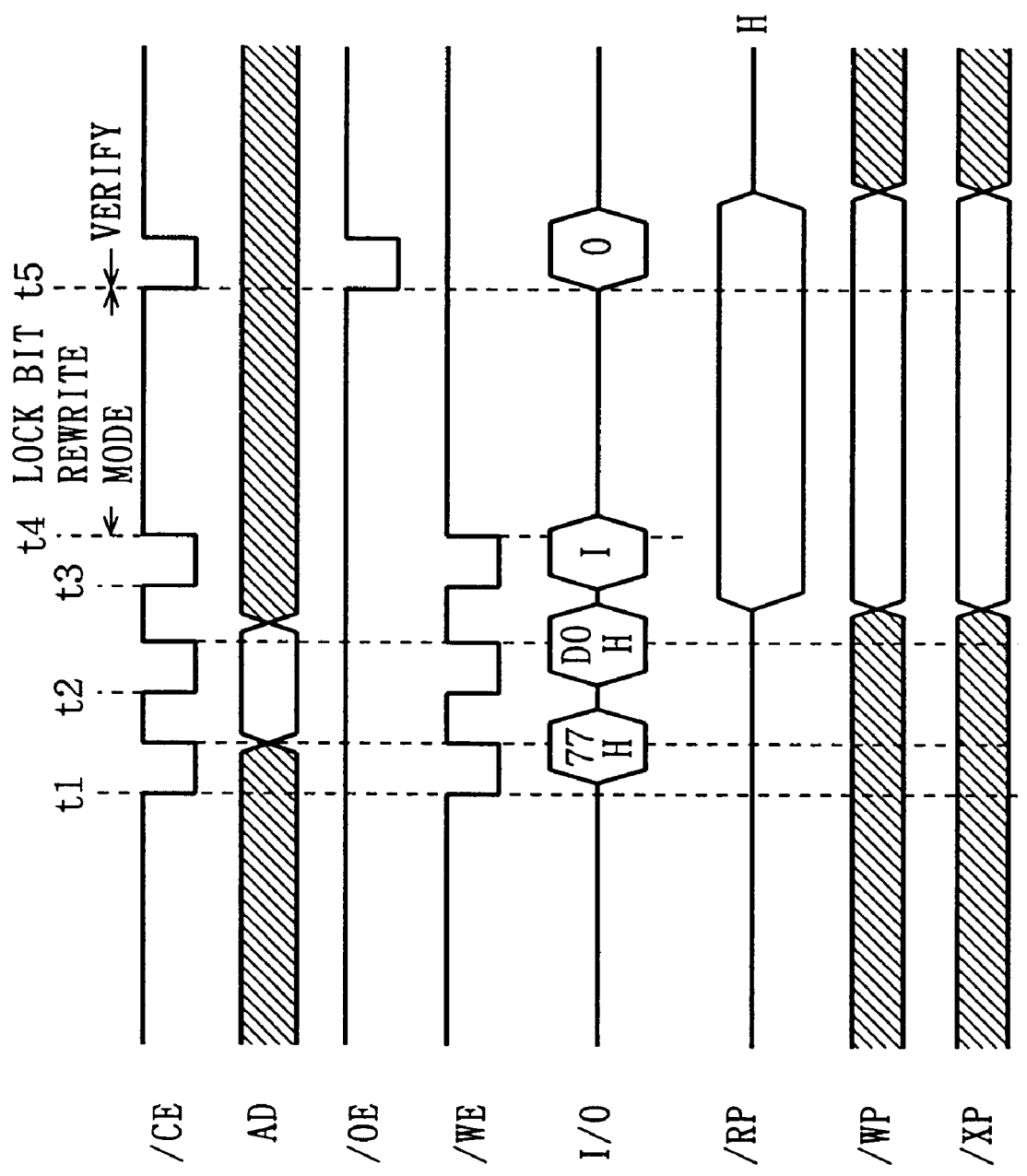
FIG. 9 shows the sequence of a control signal in a lock bit setting mode.

FIG. 9 shows the state of external signals in the rewrite sequence of lock bit LB. At time t1, chip enable signal /CE is driven to an active state of an L level, and code 77H is input. In response, the first command for setting a lock bit is applied. At time t2, chip enable signal /CE is driven to the active state of an L level again, and code D0H is input. The lock bit set mode is specified by these two codes. When chip enable signal CE is active at time t2, address signal AD is set to the block address that specifies the memory block for specifying lock bit LB. Thus, the memory block to have lock bit LB rewritten is identified.

At time t3, chip enable signal CE is pulled down to an L level of an active state, and data (I) of the lock bit to be set is input. Here, external control signals /RP, /WP and /XP are set to respective predetermined states. Accordingly, an internal lock bit rewrite mode is executed when chip enable signal CE and write enable signal /WE are at an H level at time t4. The actual rewriting of the data of lock bit LB is determined by the combination of the states of external signals /RP, /WP and /XP.

At the completion of this lock bit rewrite mode at time t5, output enable signal /OE and chip enable signal /CE are driven to the active state of an L level, and the data (O) stored in the status register is read out so that the external device can verify that lock bit LB has been rewritten. Thus, confirmation can be made of this lock bit being updated to a predetermined state.

Figure 10:
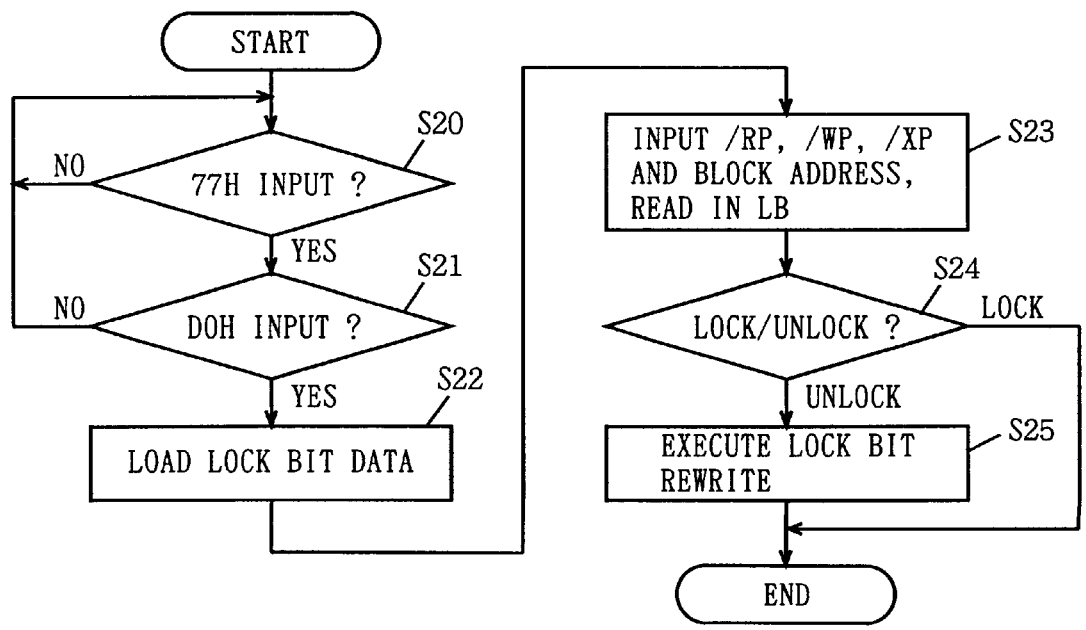
FIG. 10 is a flow chart showing an operation of the control circuit of FIG. 4 in a lock bit set sequence.

FIG. 10 is a flow chart showing an operation of the control circuit shown in FIG. 4 in this lock bit set mode. First, mode determination circuit 4a determines whether code 77H is input or not (step S20). If code 77H is input, mode determination circuit 4a awaits for the input of the next command to set a lock bit. At the input of code D0H (step S21), mode determination circuit 4a determines that a lock bit set mode is instructed. Protect control circuit 4c and program/erasure control circuit 4d are activated. When code D0H is not input at step S21, determination is made that a lock bit set command is not applied. The control returns to the initial state.

Then, data indicating the value of lock bit LB to be set is loaded (step S22). This lock bit data is provided to LB read/write circuit 8 to be latched under control of program/erasure control circuit 4d of FIG. 4.

Next, decoder 4b receives external control signals /RP, /WP and /XP, and protect control circuit 4c receives a block address signal. Similar to the previous write/erasure mode, program/erasure control circuit 4d activates LB read/write circuit 8. Protect control circuit 4c reads in the value of lock bit LB for the addressed memory block under control of program/erasure control circuit 4d (step S23).

Protect control circuit 4c determines the inhibition/permission (lock/unlock) state of rewriting the value of lock bit LB for the addressed memory block according to the signal read in (step S24). When lock bit rewriting is permitted (unlock state), the lock bit is rewritten according to the lock bit data latched by LB read/write circuit 8 under control of program/erasure control circuit 4d (step S25). In this lock bit rewriting operation, the nonvolatile memory cell storing this lock bit is set to an erasure state or programmed state according to the write data latched in LB read/write circuit 8 after the lock bit is driven to an erasure state, like the data writing operation of a memory cell. When lock bit rewriting is inhibited (lock state) at step S24, lock bit LB is not rewritten. The external ready/busy signal is set to a ready state to permit external access. Also, completion of the lock bit rewriting mode is signaled.

In the lock data updating operation according to the flow chart of FIG. 10, lock bit LB is read in and the lock/unlock state of the rewrite for this lock bit is determined. This is to have the control sequence to be identical to that of the case where the lock/unlock state of the writing/erasure of the previous normal memory cell data is determined. A structure can be implemented in which the lock bit rewriting operation is inhibited/permitted according to a combination of the states of external control signals /RP, /WP and /XP in the lock bit rewriting mode.

[First Structure of Protect Control Circuit]

Figure 11:
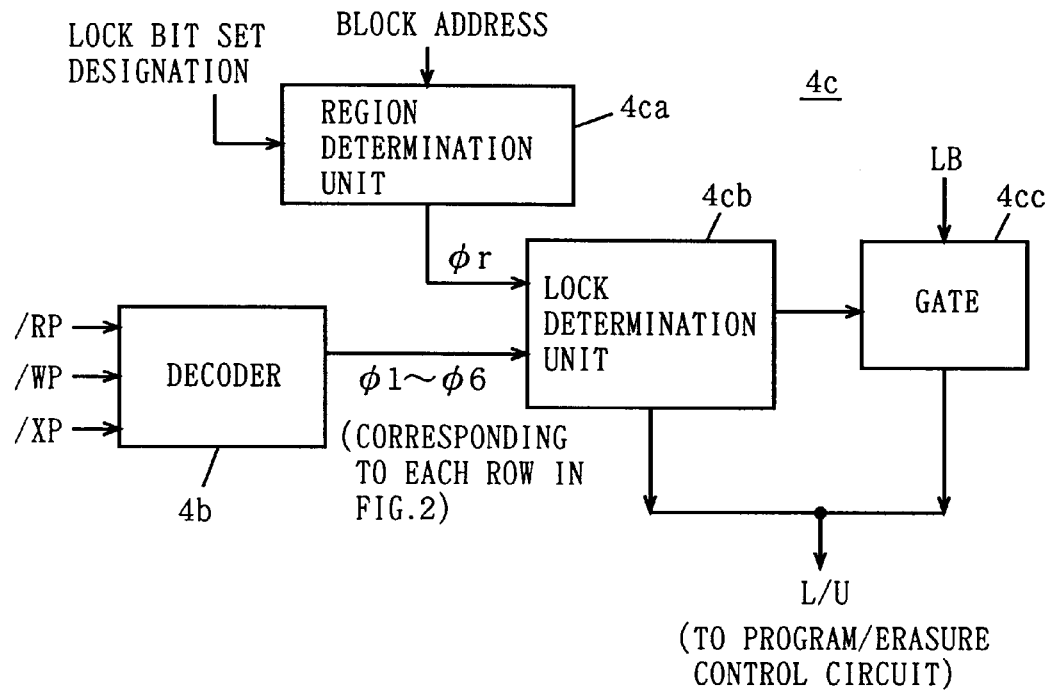
FIG. 11 schematically shows a structure of the protect control circuit of FIG. 4.

FIG. 11 schematically shows a structure of a protect control circuit 4c of FIG. 4. Referring to FIG. 11, decoder 4b drives one of control signals $\phi 1-\phi 6$ corresponding to respective rows in FIG. 2 to an active state according to the state of external control signals /RP, /WP and /XP. Here, control signals $\phi 1-\phi 6$ output from decoder 4b in FIG. 11 are employed to clarify the relationship of external control signals /RP, /WP and /XP. As shown in FIG. 2, four types of protect status can be specified by decoder 4b. Therefore, control signals $\phi 1-\phi 6$ can be reduced to four signals corresponding to respective protect states.

Protect control circuit 4c includes a region determination unit 4ca receiving a block address signal and a lock bit designation, for determining where the region of rewriting (writing/erasure) is, a lock determination unit 4cb for determining the protect status according to a region specify signal $\phi r$ of region determination unit 4ca and control signals $\phi 1-\phi 6$ from decoder 4b, and a gate 4cc for selectively passing lock bit LB according to an output signal of lock determination unit 4cb. Lock determination unit 4cb generates a signal L/U indicating the lock/unlock state and sets the output of gate 4cc to a high impedance state when lock or unlock state is specified independent of the value of lock bit LB. Lock determination unit 4cb renders gate 4cc conductive, when the protect status is determined according to lock bit LB, to transmit lock bit LB to program/erasure control circuit 4d as a lock/unlock set signal.

Region determination unit 4ca determines which of the boot block region, parameter block region, and main block region includes the addressed memory block according to a specific address signal (for example, the upper significant address signal) of the block address signal. Region determination unit 4ca also generates a signal specifying a boot block region when a lock bit set designation that designates a lock bit rewriting operation is active. This is because the protect status for lock bit LB is identical to the protect status of the memory block of boot block region 1br as shown in FIG. 2. Region determination unit 4ca can be formed of a table memory to which a specific address bit of the block address signal, for example, is input.

Lock determination unit 4cb determines the protect status for the addressed memory block according to the active status of one of control signals $\phi 1-\phi 6$ from decoder 4b and the indication by region specifying signal $\phi r$ from region determination unit 4ca. For example, when external control signals /RP and /WP are both at an H level and external control signal /XP is at an L level, decoder 4b renders control signal $\phi 3$ active. When region specifying signal $\phi r$ from region determination unit 4ca indicates a parameter block region, block determination unit 4cb determines that the protect status for this data rewriting (writing/erasure) is to be determined by lock bit LB, as shown in FIG. 2. Under this state, gate 4cc is enabled, and lock bit LB is applied to program/erasure control circuit 4d. Lock determination unit 4cb can be realized by a logic gate or a gate array that satisfies the logic relationship of the table shown in FIG. 2, using control signals $\phi 1-\phi 6$ and region specifying signal $\phi r$. Alternatively, lock determination unit 4cb can be formed of a processor and the like.

As shown in FIG. 11, the protect status can be specified on a region-by-region basis by determining the protect status according to which region including an addressed memory block through region determination unit 4ca.

[Second Structure of Protect Control Circuit]

Figure 12:
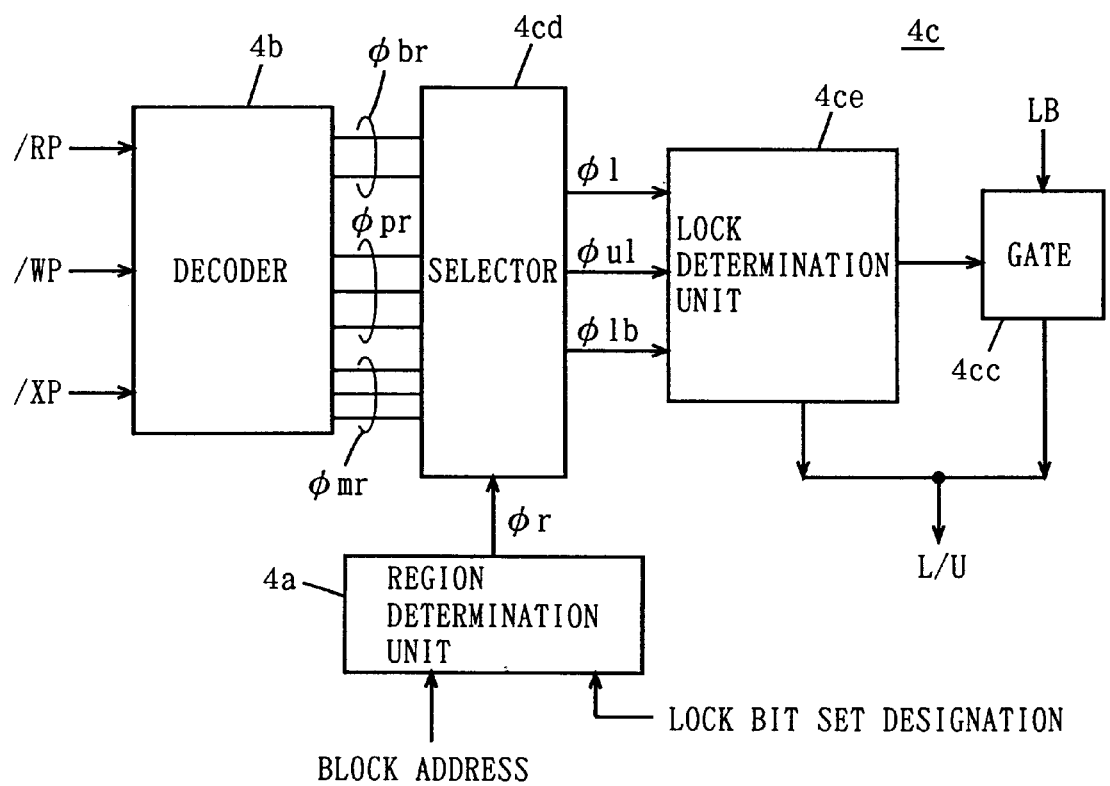
FIG. 12 shows another structure of the protect control circuit of FIG. 4.
Figure 13:
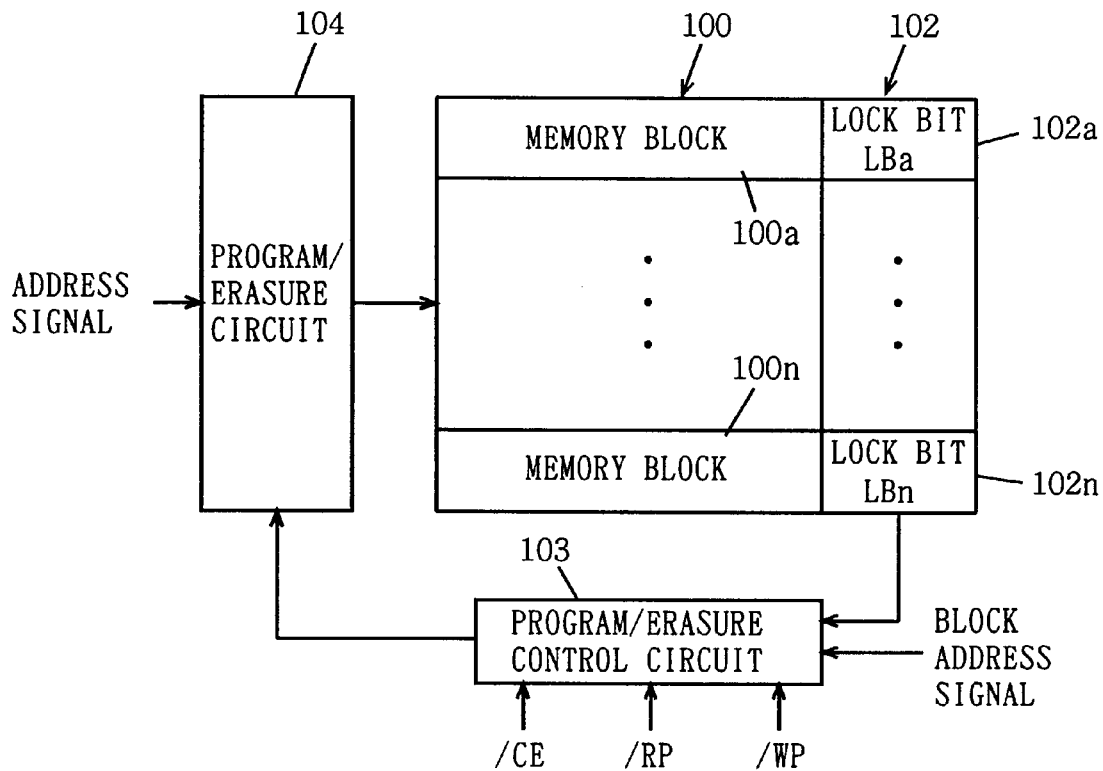
FIG. 13 schematically shows a structure of main components of a conventional nonvolatile semiconductor memory device.
Figure 14:
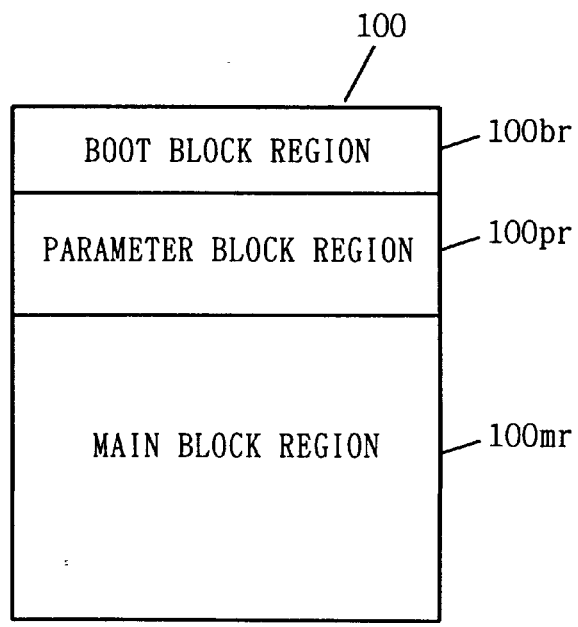
FIG. 14 schematically shows the divided structure of the memory array of FIG. 13.

FIG. 12 shows another structure of protect control circuit 4c of FIG. 4. According to the structure shown in FIG. 12, decoder 4b provides a signal indicating the lock/unlock/lock bit for each region according to external control signals /RP, /WP and /XP. More specifically, decoder 4b outputs a signal $\phi br$ indicating the lock/unlock state for boot block region 1br, a signal $\phi pr$ indicating the lock/unlock state for parameter block region 1pr, and a signal $\phi mr$ indicating the lock/unlock for main block region 1mr.

Protect control circuit 4c includes a region determination unit 4a receiving a block address signal and a lock bit specifying designation for determining the region where data rewriting is to be carried out, a selector 4cd for selecting one of output signals $\phi br$, $\phi pr$ and $\phi mr$ of decoder 4b according to region specifying signal $\phi r$ from region determination unit 4a, a lock determination unit 4ce receiving output signals $\phi 1$, $\phi u1$, and $\phi 1b$ from selector 4cd for determining the protect status for this data rewriting, and a gate 4cc for selectively passing lock bit LB according to the control signal output from lock determination unit 4ce.

Selector 4cd selects a signal set corresponding to the region specified by region specifying signal $\phi r$ that is output from region determination unit 4a, for generating a lock designating signal $\phi 1$, an unlock designating signal $\phi u1$, and a lock bit dependent designating signal $\phi 1b$.

Lock determination unit 4ce determines the protect state according to which of designating signals φ1, φu1, and φ1b from selector 4cd attains an active state. When either lock designating signal φ1 or unlock designating signal φu1 is active, lock determination unit 4ce provides a signal indicating lock/unlock state and sets the output of gate 4cc to a high impedance state. When lock bit dependent designating signal φ1b attains an active state, lock determination unit 4ce enables gate 4cc for passing lock bit LB to program/erasure control circuit 4d as a lock/unlock designating signal.

Region determination unit 4a and gate 4cc according to the structure shown in FIG. 12 are similar to those of the structure shown in FIG. 11.

A structure for generating a protect status designating signal for each region from decoder 4b is provided. The structure for determination by lock determination unit 4ce can be simplified.

Other Applications

The nonvolatile semiconductor memory device of the present invention may be a flash memory (flash EEPROM) that has erasure carried out on a memory block-by-memory block basis. Alternatively, the nonvolatile semiconductor memory device may be an electrically programmable and erasable EEPROM in which a normal erasure is carried out on a byte-by-byte basis, a serial EEPROM in which data is output serially, and a ferroelectric memory (FRAM) using ferroelectric material for data storage. The present invention is applicable to any nonvolatile memory having a protect feature for data rewriting.

The present invention is also applicable to any memory of a structure having a memory array with a plurality of address regions wherein the type of data stored in each address region differs from each other.

The nonvolatile memory of the present invention can be used for the memory of a portable telephone system, the memory of an IC card, the program/data memory for a digital still camera, and a portable information equipment (PDA).

Since a structure is provided in which the protect status can be determined for each region in a memory array divided into a plurality of regions, the protect status can be set in a flexible manner depending on the processing application. Therefore, erroneous rewriting (erroneous writing/erasure) can be prevented reliably. The user can easily set the protect status according to the process application.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of memory block regions, each memory block region including at least one memory block for storing data in a nonvolatile manner, each memory block region storing data of a different attribute;
    control circuitry for setting data rewriting protection status for said plurality of memory block regions on a region-by-region basis according to states of a plurality of external control signals, so that the protection status of one of said memory block regions can be made different from the protection status of another of said memory block regions.

2. The semiconductor memory device according to claim 1, further comprising means corresponding to each of the memory blocks, for storing a lock bit indicating a state of inhibition or permission of rewriting of data stored in a corresponding memory block,
    wherein said control circuitry comprises means for determining whether a corresponding lock bit is to be made valid or invalid on the region-by-region basis according to the states of said plurality of external control signals.

3. The semiconductor memory device according to claim 1, wherein said plurality of external control signals include a reset power down mode designating signal that designates a power down mode for reducing consumed current, and first and second write protect designating signals for designating absence and presence of protect for data rewriting.

4. The semiconductor memory device according to claim 1, wherein said data rewriting includes erasure of stored data, and programming and storage of external data.

5. The semiconductor memory device according to claim 1, further comprising a lock bit storage section for storing lock bits for respective memory blocks, a lock bit indicating whether data rewriting of a corresponding memory block is allowed, and
    wherein said control circuitry includes a decoder for decoding the external control signals to generate a protect control signal indicating the protect status for the memory block regions on a regional basis,
    a region determinator operative according to a block address signal specifying a memory block, for identifying a memory block region including a specified memory block by said block address signal,
    a lock determinator for determining the write protect status of the specified memory block in accordance with said protect control signal and an output signal of said region determinator, to selectively make a lock bit for the specified memory block valid or invalid, and to force the lock bit into one of a locking state prohibiting data rewriting when the lock bit is made invalid, in accordance with a result of determination, and
    a write control circuit for controlling a data rewriting operation for the specified memory block in accordance with the lock bit received from the lock determinator.

6. The semiconductor memory device according to claim 1, further comprising a lock bit storage section for storing lock bits for respective memory blocks, a lock bit indicating whether data rewriting of a corresponding memory block is allowed, and
    wherein said control circuitry includes:
        a decoder for decoding the external control signals to generate protect control signals indicating the protect status for the respective memory block regions,
        a region determinator operative according to a block address signal specifying a memory block, for identifying a memory block region including a specified memory block by the block address signal,
        a selector operative according to an output signal of the region determinator for selecting a protect control signal for the memory block region identified by the region determinator among the protect control signals from the decoder,
        a lock determinator for determining the write protect status of the specified memory block in accordance with said control signal and an output signal of said region determinator, to selectively make a lock bit for the specified memory block valid or invalid, and to force the lock bit into one of a locking state prohibiting data rewriting and an unlocking state permitting data rewriting when the lock bit is made invalid, in accordance with a result of determination, and a rewrite control circuit for controlling a data rewriting operation for the specified memory block in accordance with the lock bit received from the lock determinator.

7. A semiconductor memory device including a plurality of nonvolatile memory blocks, and having a write protect feature, comprising:

lock bit storage sections corresponding respectively to said plurality of nonvolatile memory blocks, for storing lock bits indicating whether data rewriting of corresponding memory blocks is allowed;

first and second write protect designating signal input pins, so that a write protect state of each of said plurality of nonvolatile memory blocks can be set on a region by region basis, the region including at least one memory block, through signals applied to the first and second write protect designating signal pins, the write protect state including a first mode in which allowance of data rewriting of a memory block is determined in accordance with a value of a corresponding lock bit and a second mode in which allowance of data rewriting of the memory block is determined regardless of the value of the corresponding lock bit.

8. A semiconductor memory device, comprising:

a plurality of memory block regions each including at least one memory block for storing data in a nonvolatile manner;

a plurality of lock bit storage circuits provided corresponding to respective memory blocks of said plurality of memory block regions, for storing lock bits indicating whether corresponding memory blocks are allowed to rewrite storage data;

mode setting circuitry for setting write protect status for the memory blocks on a region by region basis in accordance with a combination of states of a plurality of external control signals;

protect control circuitry responsive to a data rewriting operation mode instructing signal for determining whether data rewriting of an addressed memory block is allowed in accordance with a block address signal addressing the addressed memory block, a value of a lock bit for the addressed memory block and an output signal of said mode setting circuitry.

9. The semiconductor memory device according to claim 8, wherein said plurality of external control signals includes a reset power down mode signal, a first write protect signal, and a second write protect signal.

* * * * *